US012614892B2

(12) United States Patent
Hashimoto et al.

(10) Patent No.: US 12,614,892 B2
(45) Date of Patent: Apr. 28, 2026

(54) SURFACE-EMITTING SEMICONDUCTOR LIGHT-EMITTING DEVICE

(71) Applicant: KABUSHIKI KAISHA TOSHIBA, Tokyo (JP)

(72) Inventors: Rei Hashimoto, Edogawa (JP); Hiroshi Ohno, Chuo (JP); Shinji Saito, Yokohama (JP); Tsutomu Kakuno, Fujisawa (JP); Kei Kaneko, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 922 days.

(21) Appl. No.: 17/653,366

(22) Filed: Mar. 3, 2022

(65) Prior Publication Data

US 2023/0070461 A1 Mar. 9, 2023

(30) Foreign Application Priority Data

Sep. 3, 2021 (JP) ................................. 2021-143912

(51) Int. Cl.
*H01S 5/11* (2021.01)
*H01S 5/042* (2006.01)
(Continued)

(52) U.S. Cl.
CPC ............ *H01S 5/11* (2021.01); *H01S 5/04254* (2019.08); *H01S 5/18305* (2013.01);
(Continued)

(58) Field of Classification Search
CPC .......... H01S 5/185–187; H01S 5/0425–04257; H01S 5/18375; H01S 5/18391; H01S 5/19394; H01S 5/11; H01S 5/04254
See application file for complete search history.

(56) References Cited

U.S. PATENT DOCUMENTS

2002/0141472 A1* 10/2002 Koyama ............. H01S 5/18394
372/96
2008/0240193 A1* 10/2008 Noda ..................... B82Y 20/00
372/49.01
(Continued)

FOREIGN PATENT DOCUMENTS

JP 2009-231773 A 10/2009
JP 2012-142508 A 7/2012
(Continued)

OTHER PUBLICATIONS

Liang, Y. et al., "Room temperature surface emission on large-area photonic crystal quantum cascade lasers," Applied Physics Letters, vol. 114, 2019, 6 pages.
(Continued)

*Primary Examiner* — Sean P Hagan
(74) *Attorney, Agent, or Firm* — Oblon, McClelland, Maier & Neustadt, L.L.P.

(57) ABSTRACT

A surface-emitting semiconductor light-emitting device includes a semiconductor substrate; a first semiconductor layer on a front surface of the semiconductor substrate, an active layer on the first semiconductor layer; a photonic crystal layer on the active layer, a second semiconductor layer on the photonic crystal layer, a first electrode on the second semiconductor layer; and a second electrode on a back surface of the semiconductor substrate. The photonic crystal layer includes a plurality of protrusions arranged along an upper surface of the active layer. The second electrode includes a planar contact portion contacting the back surface of the semiconductor substrate, and at least one fine wire contact portion extending into a surface-emitting region in the back surface of the semiconductor substrate. The light radiated from the active layer is externally emitted from the surface-emitting region. The fine wire contact
(Continued)

portion is arranged in the surface-emitting region with rotationally asymmetric.

19 Claims, 13 Drawing Sheets

(51) Int. Cl.

| | | |
|---|---|---|
| *H01S 5/183* | (2006.01) |
| *H01S 5/187* | (2006.01) |
| *H01S 5/22* | (2006.01) |
| *H01S 5/34* | (2006.01) |

(52) U.S. Cl.
CPC ...... *H01S 5/18347* (2013.01); *H01S 5/18375* (2013.01); *H01S 5/18391* (2013.01); *H01S 5/18394* (2013.01); *H01S 5/187* (2013.01); *H01S 5/22* (2013.01); *H01S 5/3402* (2013.01); *H01S 2301/18* (2013.01)

(56) References Cited

U.S. PATENT DOCUMENTS

| | | | | |
|---|---|---|---|---|
| 2018/0026419 A1* | 1/2018 | Hirose | ................ | H01S 5/18394 |
| | | | | 353/22 |
| 2019/0199064 A1* | 6/2019 | Hashimoto | ....... | H01L 21/02458 |
| 2020/0106240 A1* | 4/2020 | Takiguchi | ............. | H01S 5/0286 |
| 2021/0399526 A1 | 12/2021 | Hashimoto et al. | | |

FOREIGN PATENT DOCUMENTS

| | | | |
|---|---|---|---|
| JP | 6329893 | B2 | 5/2018 |
| JP | 2018-93022 | A | 6/2018 |
| JP | 2018-206921 | A | 12/2018 |
| JP | 6513626 | B2 | 5/2019 |
| JP | 2022-2245 | A | 1/2022 |

OTHER PUBLICATIONS

Japanese Office Action issued Oct. 2, 2024 in Japanese Patent Application No. 2021-143912 (wit unedited computer-generated English translation), 8 pages.

* cited by examiner

180f

RW

SER fc

180f

SURFACE-EMITTING SEMICONDUCTOR LIGHT-EMITTING DEVICE

CROSS-REFERENCE TO RELATED APPLICATIONS

This application is based upon and claims the benefit of priority from Japanese Patent Application No. 2021-143912, filed on Sep. 3, 2021; the entire contents of which are incorporated herein by reference.

FIELD

Embodiments relate to a surface-emitting semiconductor light-emitting device.

BACKGROUND

It is desirable to improve the light output characteristics of a surface-emitting semiconductor light-emitting device.

DETAILED DESCRIPTION

Figure 1:
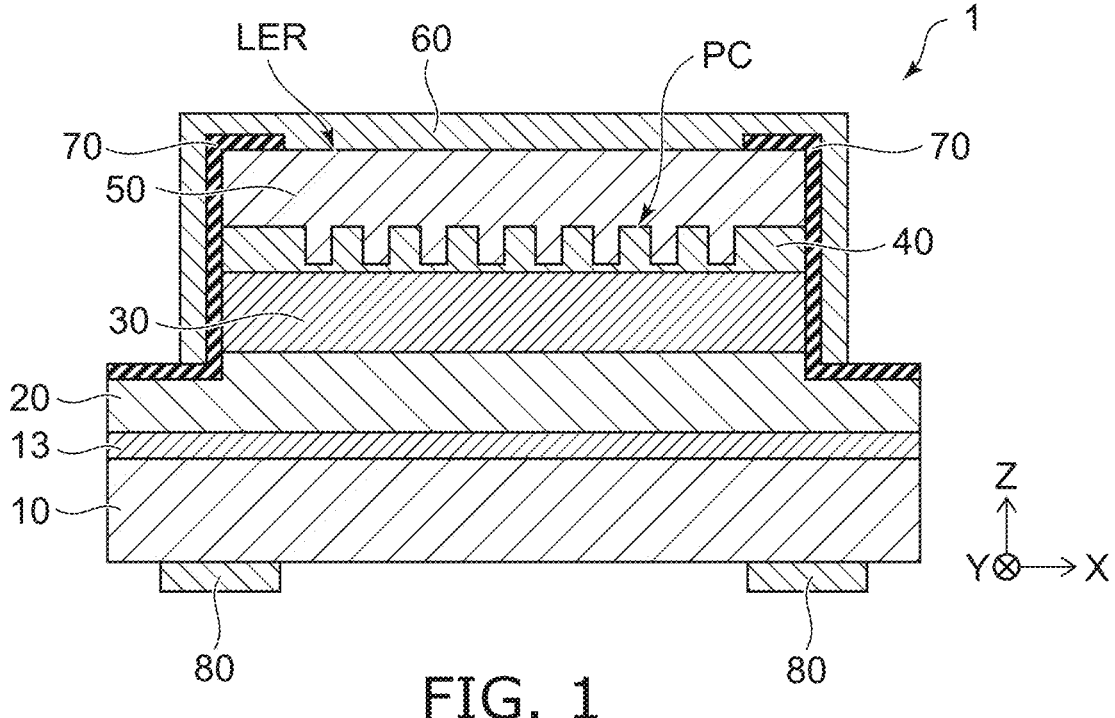
FIG. 1 is a schematic cross-sectional view showing a surface-emitting semiconductor light-emitting device according to a first embodiment.

According to one embodiment, a surface-emitting semiconductor light-emitting device includes a semiconductor substrate of a first conductivity type; a first semiconductor layer provided on a front surface of the semiconductor substrate, the first semiconductor layer being of the first conductivity type; an active layer provided on the first semiconductor layer; a photonic crystal layer provided on the active layer, the photonic crystal layer including a plurality of protrusions arranged along an upper surface of the active layer; a second semiconductor layer provided on the photonic crystal layer, the second semiconductor layer being of the first conductivity type; a first electrode provided on the second semiconductor layer; and a second electrode provided on a back surface of the semiconductor substrate. The semiconductor substrate is positioned between the first semiconductor layer and the second electrode. The second electrode includes a planar contact portion contacting the back surface of the semiconductor substrate, and at least one fine wire contact portion extending into a surface-emitting region in the back surface of the semiconductor substrate. The light radiated from the active layer is externally emitted from the surface-emitting region. The fine wire contact portion is arranged in the surface-emitting region with rotationally asymmetric.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a surface-emitting semiconductor light-emitting device 1 according to a first embodiment. The semiconductor light-emitting device 1 is a surface-emitting QCL (Quantum Cascade Laser).

As shown in FIG. 1, the semiconductor light-emitting device 1 includes a semiconductor substrate 10 of a first conductivity type, a first semiconductor layer 20 of the first conductivity type, an active layer 30, a photonic crystal layer 40, a second semiconductor layer 50 of the first conductivity type, a first electrode 60, an insulating film 70, and a second electrode 80.

The semiconductor substrate 10 is, for example, an n-type InP substrate or an n-type GaAs substrate. When a GaAs substrate is used as the semiconductor substrate 10, a buffer layer 13 is provided between the semiconductor substrate 10 and the first semiconductor layer 20. The buffer layer 13 is, for example, an n-type InGaAs layer. Although the first conductivity type is an n-type in the following description, the first conductivity type is not limited thereto. InGaAs is a semiconductor mixed crystal of the compositional formula $In_xGa_{1-x}As$ (0<x<1).

The first semiconductor layer 20 is provided on the semiconductor substrate 10. The first semiconductor layer 20 is, for example, an n-type InP layer. The first semiconductor layer 20 includes, for example, a first-conductivity-type impurity with a lower concentration than a concentration of a first-conductivity-type impurity in the semiconductor substrate 10.

The active layer 30 is provided on the first semiconductor layer 20. For example, the active layer 30 has a quantum well structure that allows intersubband transitions of carriers. The active layer 30 includes, for example, an n-type Group III-V compound semiconductor crystal doped with silicon and emits light due to intersubband transitions of electrons.

The photonic crystal layer 40 is provided on the active layer 30. The photonic crystal layer 40 has a specific periodic structure PC and controls the propagation direction of the light emitted from the active layer 30. The photonic crystal layer 40 includes, for example, multiple protrusions arranged along the upper surface of the active layer 30. The photonic crystal layer 40 includes, for example, InGaAs.

The second semiconductor layer 50 is provided on the photonic crystal layer 40. The second semiconductor layer 50 is, for example, an n-type InP layer. The second semiconductor layer 50 includes, for example, a first-conductivity-type impurity with a lower concentration than the concentration of the first-conductivity-type impurity in the semiconductor substrate 10.

The first electrode 60 is provided on the second semiconductor layer 50. For example, the first electrode 60 has an ohmic connection with the second semiconductor layer 50. The first electrode 60 includes a material that reflects the light radiated from the active layer 30. The first electrode 60 reflects the light traveling from the active layer 30 toward the first electrode 60 and changes the propagation direction of the light toward the semiconductor substrate 10. The first electrode 60 includes, for example, gold (Au).

As shown in FIG. 1, the semiconductor light-emitting device 1 includes a light-emitting region LER that has a mesa structure. The light-emitting region LER includes the second semiconductor layer 50, the photonic crystal layer 40, the active layer 30, and a portion of the first semiconductor layer 20. The insulating film 70 covers the side surface of the mesa structure. The insulating film 70 is provided between the first electrode 60 and the light-emitting region LER. The insulating film 70 is, for example, a silicon oxide film.

The first electrode 60 covers the side surface of the mesa structure and a portion of the first semiconductor layer 20 with the insulating film 70 interposed. The light that travels externally through the side surface of the mesa structure also is reflected by the first electrode 60 and returned to the interior of the light-emitting region LER.

The second electrode 80 is provided on the back surface of the semiconductor substrate 10 at the side opposite to the active layer 30. For example, the second electrode 80 has a structure in which a titanium (Ti) layer and a gold (Au) layer are stacked. The Ti layer is provided between the semiconductor substrate 10 and the Au layer.

In the semiconductor light-emitting device 1, carriers (electrons) are injected into the active layer 30 by a current flowing between the first electrode 60 and the second electrode 80. The active layer 30 generates QCL light due to the light generated by energy relaxation of the carriers in the quantum wells and stimulated emission due to the light guided by the photonic crystal layer 40. The QCL light is externally radiated from the back surface of the semiconductor substrate 10. The wavelength of the QCL light is, for example, 4.5 micrometers (μm).

Figure 2A:
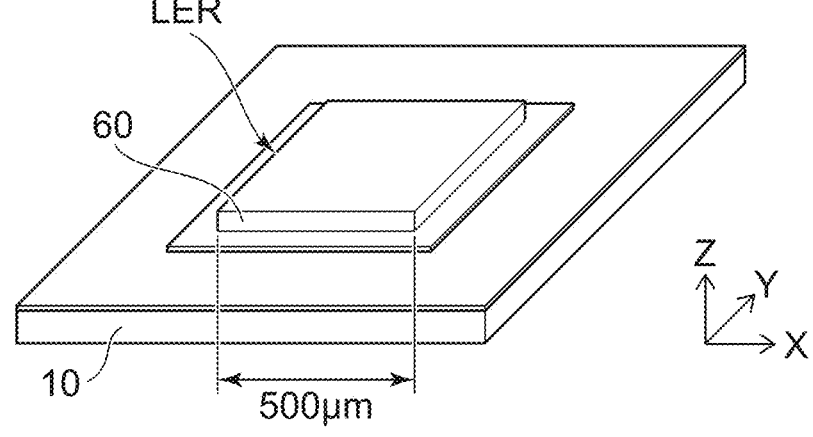
FIGS. 2A and 2B are perspective views schematically showing the semiconductor light-emitting device according to the first embodiment.
Figure 2B:
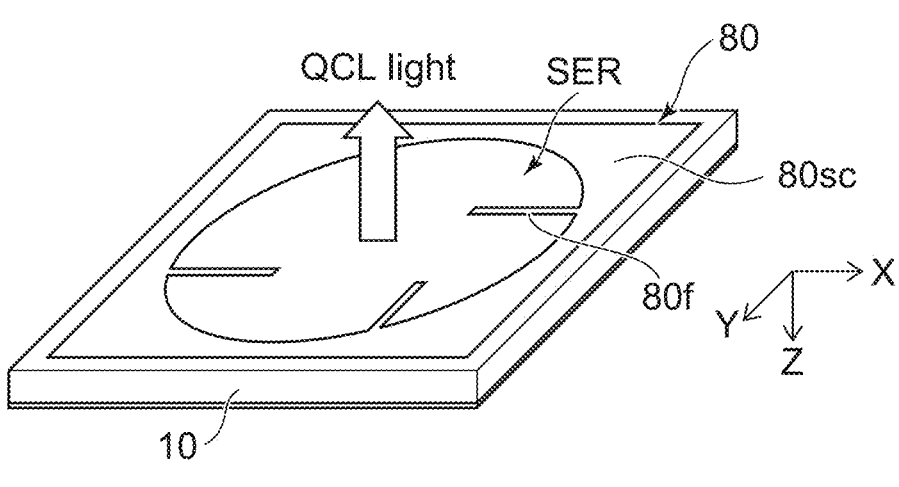

FIGS. 2A and 2B are perspective views schematically showing the semiconductor light-emitting device 1 according to the first embodiment. FIG. 2A is a perspective view showing the front side of the semiconductor light-emitting device 1. FIG. 2B is a perspective view showing the back-side of the semiconductor light-emitting device 1.

As shown in FIG. 2A, the light-emitting region LER is provided at the front side of the semiconductor substrate 10. The light-emitting region LER is, for example, a rectangular parallelepiped that has a lateral width of 500 μm. The first electrode 60 covers the light-emitting region LER and the front surface of the semiconductor substrate 10 around the light-emitting region LER.

As shown in FIG. 2B, the QCL light is externally radiated from the back surface of the semiconductor substrate 10. The second electrode 80 includes, for example, a planar contact portion 80sc and a fine wire contact portion 80f. The planar contact portion 80sc surrounds a surface-emitting region SER of the back surface of the semiconductor substrate 10. The fine wire contact portion 80f extends from the planar contact portion 80sc into the surface-emitting region SER along the back surface of the semiconductor substrate 10.

The semiconductor substrate 10 transmits the QCL light, but the optical absorption of the semiconductor substrate 10 is nonzero. Accordingly, the output of the QCL light can be improved by reducing the thickness in the Z-direction of the semiconductor substrate 10 (see FIG. 1). In such a case, the current injected from the second electrode 80 into the active layer 30 may have a vertical component and a horizontal component. The vertical component flows in the direction from the semiconductor substrate 10 toward the active layer 30. The horizontal component flows in a direction along the back surface of the semiconductor substrate 10. As the semiconductor substrate 10 is thinned, for example, the horizontal component becomes greater than the vertical component. Therefore, more current is injected into the outer perimeter portion of the active layer 30 than into the center of the active layer 30. As a result, the electron injection into the active layer 30 becomes nonuniform, and the luminous efficiency decreases.

In the semiconductor light-emitting device 1 according to the embodiment, the electron injection into the active layer 30 is made uniform by providing the fine wire contact portion 80f that extends into the surface-emitting region SER.

Figure 3:
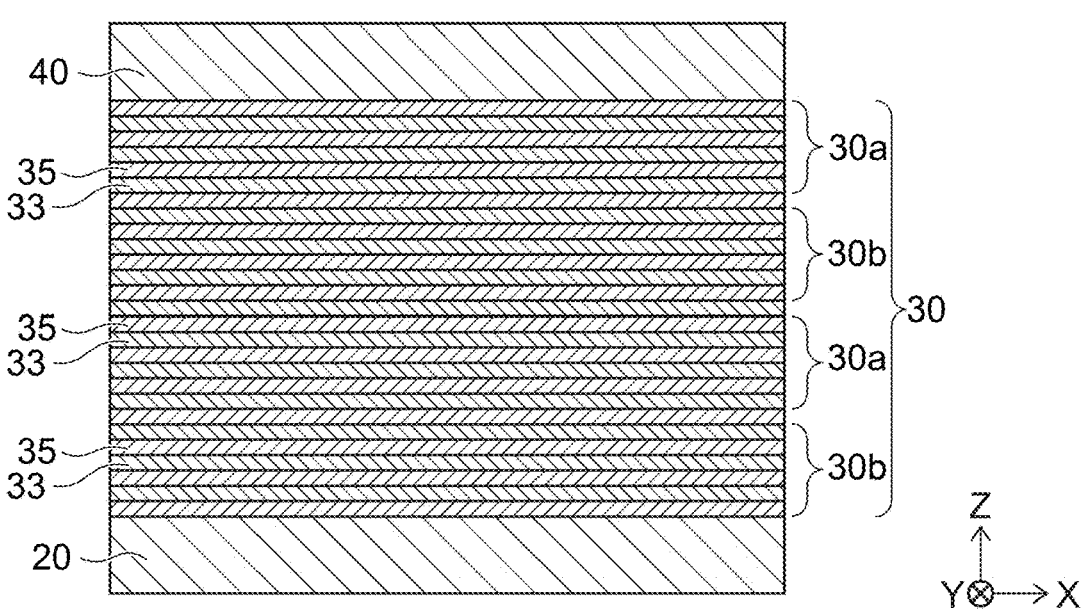
FIG. 3 is a schematic cross-sectional view showing the active layer 30 of the semiconductor light-emitting device according to the first embodiment.

FIG. 3 is a schematic cross-sectional view showing the active layer 30 of the semiconductor light-emitting device 1 according to the first embodiment. For example, the active layer 30 has a quantum well structure in which a quantum well layer 33 and a barrier layer 35 are alternately stacked in a direction orthogonal to the upper surface of the first semiconductor layer 20, e.g., the Z-direction. Also, the active layer 30 includes an electron injection region 30a and a light-emitting region 30b. The electron injection region 30a and the light-emitting region 30b are alternately arranged in the Z-direction. The quantum well layer 33 includes, for example, InGaAs; and the barrier layer 35 includes, for example, AlInAs. Here, AlInAs is a semiconductor mixed crystal of the compositional formula $Al_yIn_{1-y}As$ (0<y<1).

Although two pairs of the electron injection region 30*a* and the light-emitting region 30*b* are shown in FIG. 3, the embodiment is not limited thereto. The number of pairs of the electron injection region 30*a* and the light-emitting region 30*b* provided in the active layer 30 is arbitrary; for example, the active layer 30 may include not less than ten pairs.

Figure 4:
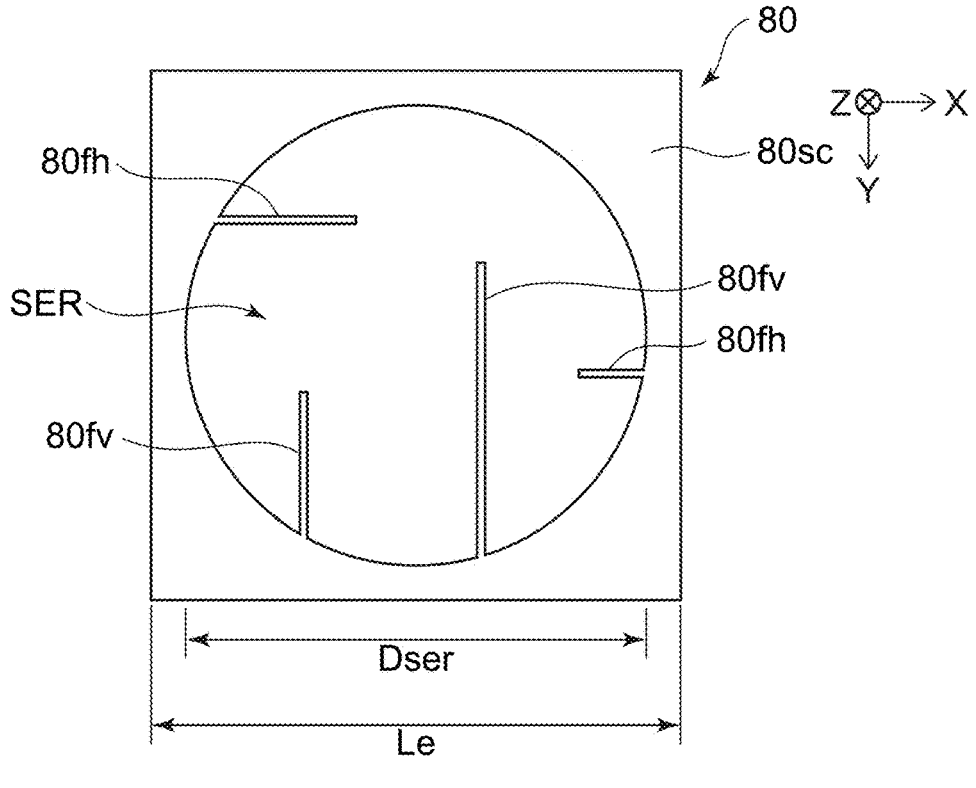
FIG. 4 is a schematic plan view showing the second electrode of the semiconductor light-emitting device according to the first embodiment.

FIG. 4 is a schematic plan view showing the second electrode 80 of the semiconductor light-emitting device 1 according to the first embodiment. FIG. 4 is a plan view illustrating the backside of the semiconductor substrate 10.

The second electrode 80 includes the planar contact portion 80*sc*, a fine wire contact portion 80*fv*, and a fine wire contact portion 80*fh*. The planar contact portion 80*sc* surrounds the surface-emitting region SER. The fine wire contact portions 80*fv* and 80*fh* each extend from the planar contact portion 80*sc* into the surface-emitting region SER.

The second electrode 80 has an outer periphery of, for example, a square of which a length Le of one side is 2000 μm. The surface-emitting region SER is, for example, circular; and a diameter Dser of the surface-emitting region SER is, for example, 1000 μm. For example, the fine wire contact portions 80*fv* and 80*fh* have a width of 10 to 20 μm. The fine wire contact portions 80*fv* and 80*fh* are provided such that the reduction of the output of the QCL light can be ignored.

The fine wire contact portion 80*fv* extends in a direction orthogonal to the fine wire contact portion 80*fh*. For example, the fine wire contact portion 80*fh* extends in the X-direction. For example, the fine wire contact portion 80*fv* extends in the Y-direction. The arrangement of the fine wire contact portions 80*fv* and 80*fh* in the surface-emitting region SER is asymmetric and has neither line symmetry nor point symmetry. The fine wire contact portions 80*fv* and 80*fh* are rotationally asymmetric.

The fine wire contact portions 80*fv* and 80*fh* each include one end linked to the planar contact portion 80*sc* and another end positioned inside the surface-emitting region SER. Multiple fine wire contact portions 80*fv* and multiple fine wire contact portions 80*fh* may be provided in the surface-emitting region SER. For example, the length from the one end to the other end may be different between the fine wire contact portions 80*fv* and 80*fh*.

Figures 5A, 5B, 5C, 5D, 5E, 5F:
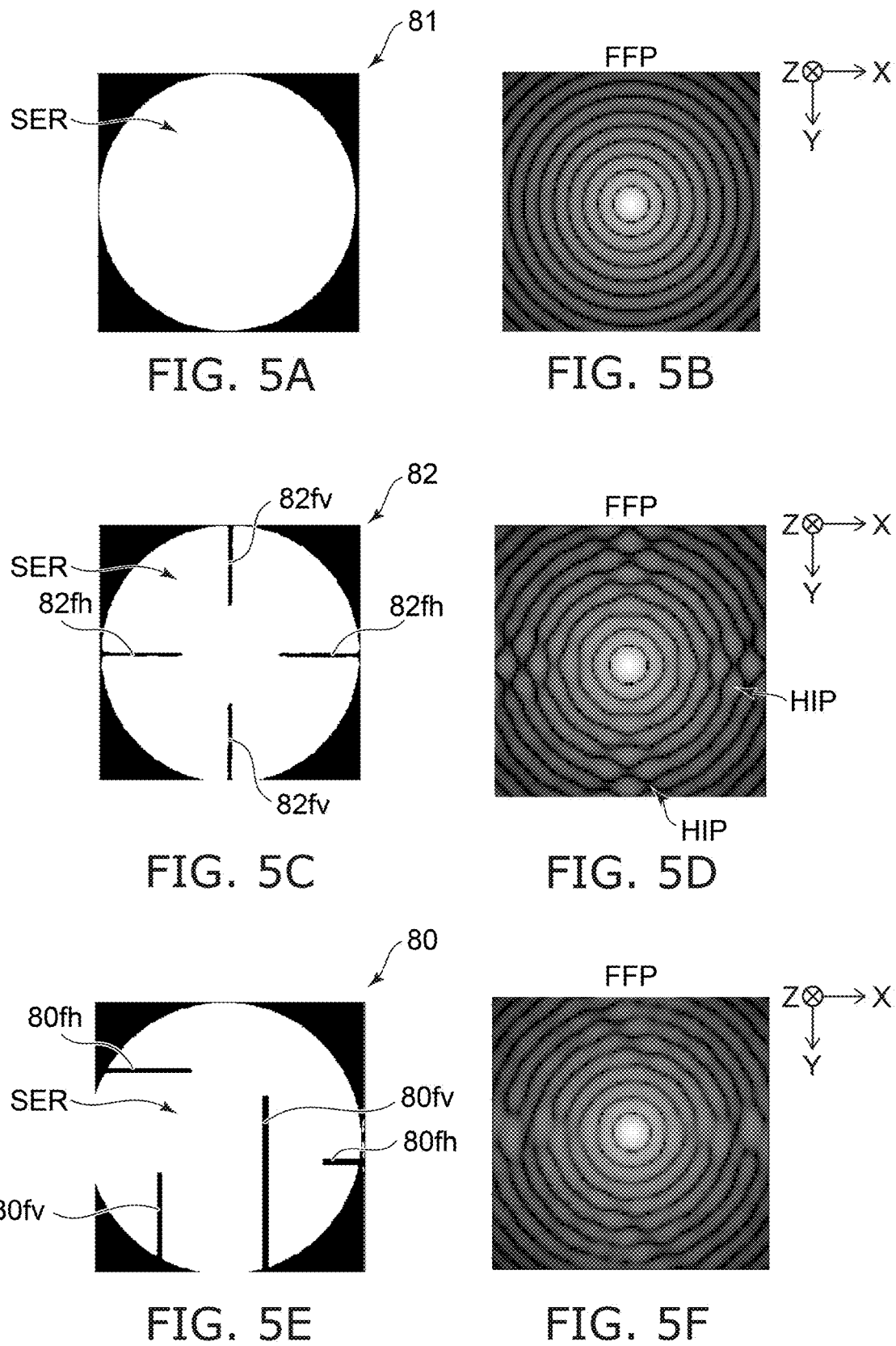
FIGS. 5A to 5F are schematic views showing output characteristics of the semiconductor light-emitting device according to the first embodiment.

FIGS. 5A to 5F are schematic views showing output characteristics of the semiconductor light-emitting device 1 according to the first embodiment. FIGS. 5A-5B illustrate a second electrode 81 and a FFP (Far Field Pattern) of the QCL light radiated from the surface-emitting region SER. FIGS. 5B-5F illustrate FFPs respectively of a second electrode 82 and the second electrode 80.

In the example shown in FIG. 5A, the second electrode 81 does not include a fine wire contact portion. The FFP due to the second electrode 81 has a concentric circular configuration with no pattern disturbance (FIG. 5B). For example, even if the current injection into the active layer 30 becomes nonuniform, disturbance of the FFP does not occur because a fine wire contact portion is not provided; however, the light output decreases. Accordingly, it is desirable to suppress the disturbance of the FFP while suppressing the reduction of the light output by providing a fine wire contact portion.

The second electrode 82 shown in FIG. 5C includes two fine wire contact portions 82*fh* and two fine wire contact portions 82*fv*. The fine wire contact portions 82*fh* extend in the X-direction. The fine wire contact portions 82*fv* extend in the Y-direction. The length in the X-direction of the fine wire contact portion 82*fh* is equal to the length in the Y-direction of the fine wire contact portion 82*fv*. The ends of the two fine wire contact portions 82*fh* face each other in the X-direction. Also, the ends of the two fine wire contact portions 82*fv* face each other in the Y-direction.

As shown in FIG. 5C, the fine wire contact portions 82*fv* and 82*fh* have 90 degree rotational symmetry. Accordingly, the FFP due to the second electrode 82 has distinct intensity peaks HIP at the positions of the fine wire contact portions 82*fv* and 82*fh* (FIG. 5D). In other words, a disturbance of the FFP occurs due to the fine wire contact portions 82*fv* and 82*fh*.

In the second electrode 80 shown in FIG. 5E, the fine wire contact portions 80*fv* and 80*fh* are rotationally asymmetric. Therefore, some disturbance of the FFP occurs due to the second electrode 80, but a distinct intensity peak HIP does not occur (FIG. 5F). In other words, the disturbance of the FFP can be suppressed by arranging the fine wire contact portions 80*fh* and 80*fv* to be rotationally asymmetric.

Figure 6:
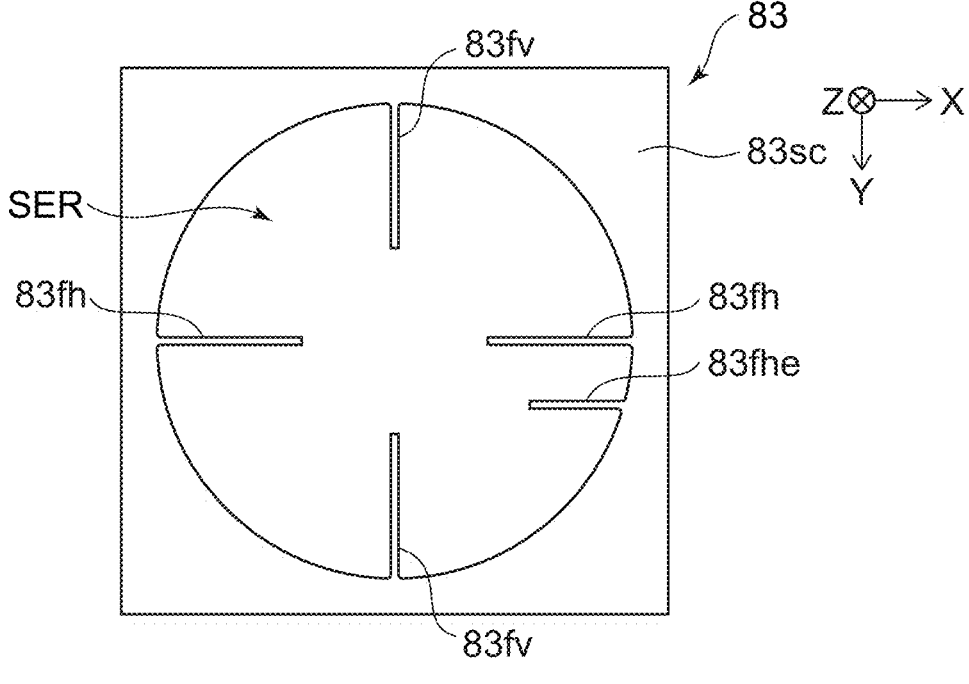
FIG. 6 is a schematic plan view showing a second electrode of the semiconductor light-emitting device according to a modification of the first embodiment.

FIG. 6 is a schematic plan view showing a second electrode 83 of the semiconductor light-emitting device 1 according to a modification of the first embodiment. In addition to fine wire contact portions 83*fh* and 83*fv* that have 90 degree rotational symmetry, the second electrode 83 further includes a fine wire contact portion 83*fhe*. For example, the fine wire contact portion 83*fhe* is apart in the Y-direction from one of the two fine wire contact portions 83*fh*.

In the example, the arrangement of the fine wire contact portions 83*fh*, 83*fv*, and 83*fhe* becomes rotationally asymmetric by adding the fine wire contact portion 83*fhe*. The disturbance of the FFP due to the second electrode 83 can be suppressed thereby.

Figures 7A, 7B:
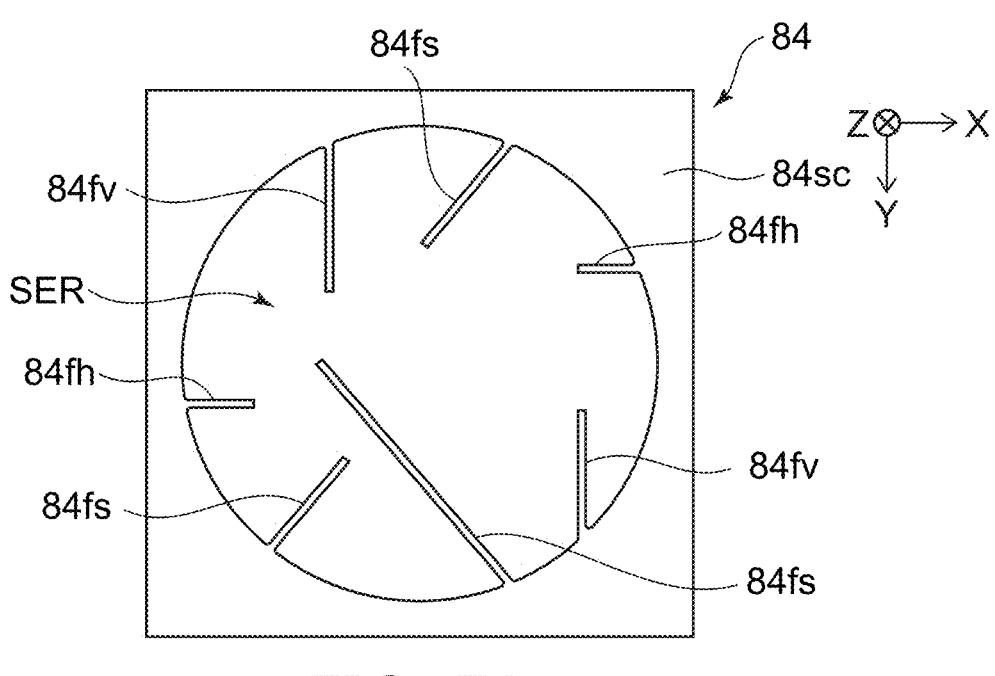
FIGS. 7A and 7B are schematic plan views showing a second electrode and a second electrode of the semiconductor light-emitting device according to other modifications of the first embodiment.

FIGS. 7A and 7B are schematic plan views showing a second electrode 84 and a second electrode 85 of the semiconductor light-emitting device 1 according to other modifications of the first embodiment.

As shown in FIG. 7A, the second electrode 84 includes a planar contact portion 84*sc* and fine wire contact portions 84*fh*, 84*fv*, and 84*fs*. The fine wire contact portions 84*fh*, 84*fv*, and 84*fs* are rotationally asymmetric and are linked to the planar contact portion 84*sc*.

The fine wire contact portion 84*fh* extends in the X-direction. The fine wire contact portion 84*fv* extends in the Y-direction. The fine wire contact portion 84*fs* extends in a direction crossing the X-direction and the Y-direction. For example, the lengths of the fine wire contact portions 84*fh*, 84*fv*, and 84*fs* are different from each other.

In the example shown in FIG. 7B, the second electrode 85 includes a planar contact portion 85*sc* and fine wire contact portions 85*fh*, 85*fv*, and 85*fs*. The fine wire contact portions 85*fh*, 85*fv*, and 85*fs* are rotationally asymmetric and are linked to the planar contact portion 85*sc*.

The fine wire contact portion 85*fh* extends in the X-direction. The fine wire contact portion 85*fv* extends in the Y-direction. The fine wire contact portion 85*fs* extends in a direction crossing the X-direction and the Y-direction. Furthermore, one fine wire contact portion 85*fs* includes a branch portion 85*fb*. Thus, each fine wire contact portion may include a portion that branches.

Figures 8A, 8B, 8C:
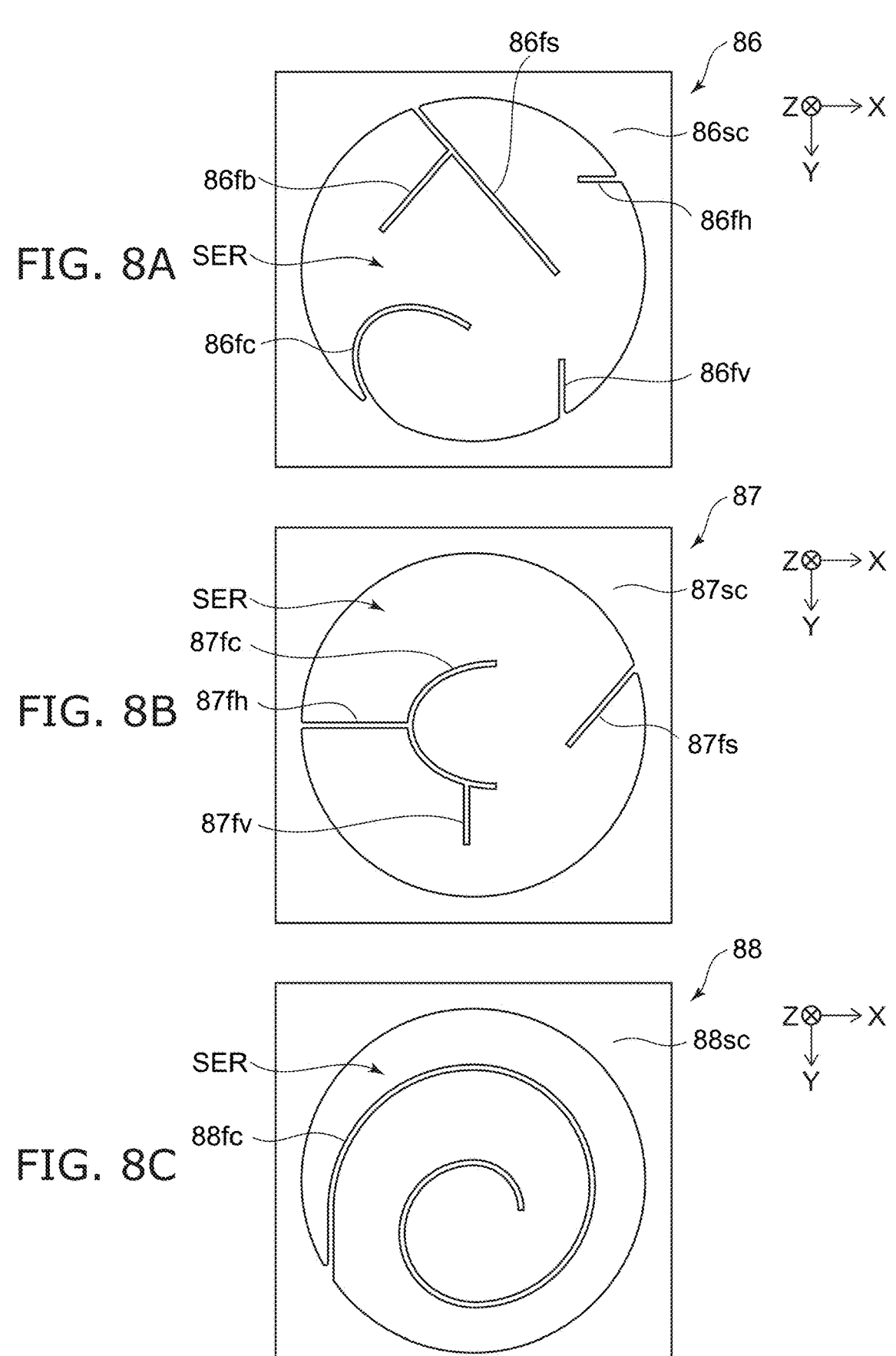
FIGS. 8A to 8C are schematic plan views showing second electrodes of the semiconductor light-emitting device according to other modifications of the first embodiment.

FIGS. 8A to 8C are schematic plan views showing second electrodes 86 to 88 of the semiconductor light-emitting device 1 according to other modifications of the first embodiment.

In the example shown in FIG. 8A, the second electrode 86 includes a planar contact portion 86*sc* and fine wire contact portions 86*fh*, 86*fv*, 86*fs*, and 86*fc*. The fine wire contact portions 86*fh*, 86*fv*, 86*fs*, and 86*fc* are rotationally asymmetric and are linked to the planar contact portion 86*sc*.

The fine wire contact portion 86*fh* extends in the X-direction. The fine wire contact portion 86*fv* extends in the Y-direction. The fine wire contact portion 86*fs* extends in a direction crossing the X-direction and the Y-direction. The fine wire contact portion 86*fs* includes a branch portion 86*fb*. The fine wire contact portion 86*fc* has a curved shape along the back surface of the semiconductor substrate 10. Thus, the shapes of the fine wire contact portions are not limited to straight lines and may include curves.

In the example shown in FIG. 8B, a second electrode 87 includes a planar contact portion 87*sc* and fine wire contact portions 87*fh*, 87*fv*, 87*fs*, and 87*fc*. The fine wire contact portions 87*fh*, 87*fv*, 87*fs*, and 87*fc* are rotationally asymmetric and are electrically connected to the planar contact portion 87*sc*.

As shown in FIG. 8B, the fine wire contact portion 87*fc* is combined with the fine wire contact portions 87*fh* and 87*fv*. The fine wire contact portion 87*fh* extends in the X-direction from the planar contact portion 87*sc*. One end of the fine wire contact portion 87*fh* is linked to the planar contact portion 87*sc*. The other end of the fine wire contact portion 87*fh* is linked to the fine wire contact portion 87*fc*. The fine wire contact portion 87*fv* branches from the fine wire contact portion 87*fc* and extends in the Y-direction. The fine wire contact portion 87*fs* extends in a direction crossing the X-direction and the Y-direction. Thus, the fine wire contact portions may have shapes that combine straight lines and curves.

In the example shown in FIG. 8C, the second electrode 88 includes a planar contact portion 88*sc* and a fine wire contact portion 88*fc*. The fine wire contact portion 88*fc* is linked to the planar contact portion 88*sc* and has, for example, a spiral shape along the back surface of the semiconductor substrate 10. The fine wire contact portion 88*fc* has a shape that combines, for example, multiple curves that have different curvatures. The fine wire contact portion 88*fc* is rotationally asymmetric in the surface-emitting region SER.

Thus, the second electrodes 80 and 82 to 88 of the surface-emitting semiconductor light-emitting device 1 include at least one fine wire contact portion provided in the surface-emitting region SER. The uniformity of the electron injection into the active layer 30 can be increased thereby. Furthermore, the disturbance of the FFP of the QCL light can be suppressed by the arrangement of the fine wire contact portion in the surface-emitting region SER being rotationally asymmetric.

The fine wire contact portions shown herein are not unique to each example and can be implemented in combination with each other.

Second Embodiment

Figure 9A:
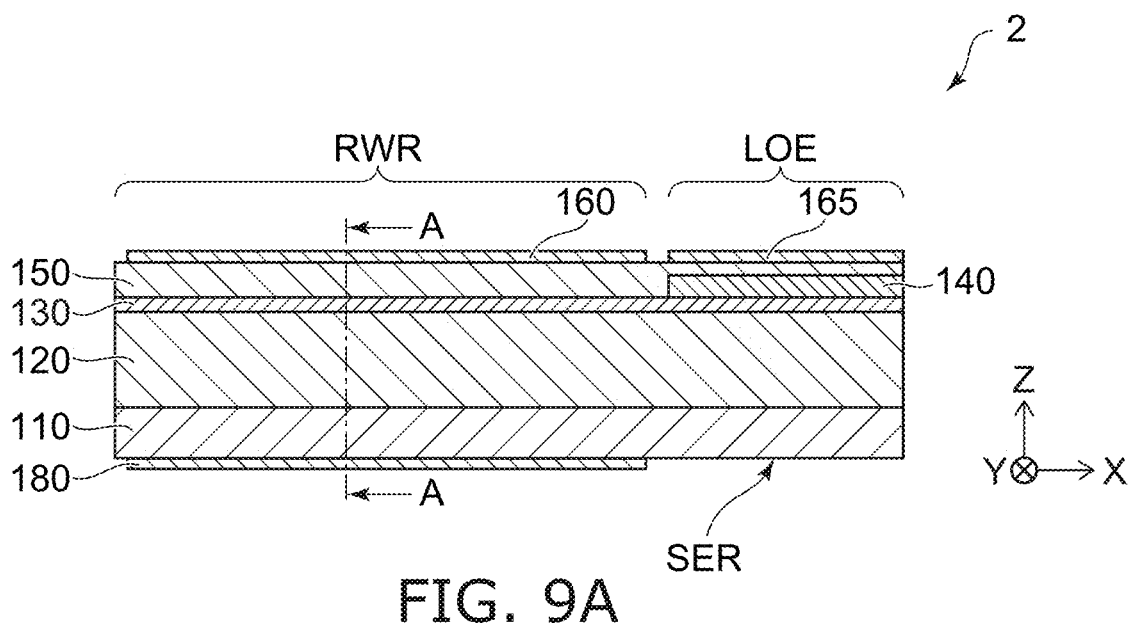
FIGS. 9A and 9B are schematic cross-sectional views showing a surface-emitting semiconductor light-emitting device according to a second embodiment.
Figure 9B:
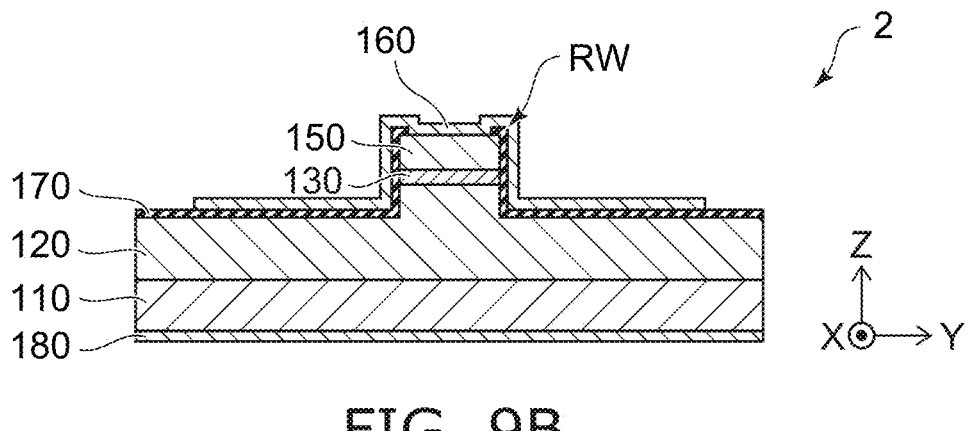

FIGS. 9A and 9B are schematic cross-sectional views showing a surface-emitting semiconductor light-emitting device 2 according to a second embodiment. FIG. 9B is a cross-sectional view along line A-A shown in FIG. 9A. The semiconductor light-emitting device 2 is, for example, a ridge-waveguide QCL.

As shown in FIG. 9A, the semiconductor light-emitting device 2 includes a semiconductor substrate 110 of the first conductivity type, a first semiconductor layer 120 of the first conductivity type, an active layer 130, a photonic crystal layer 140, a second semiconductor layer 150 of the first conductivity type, a first electrode 160, a reflective layer 165, and a second electrode 180.

The semiconductor substrate 110 is, for example, an n-type InP substrate. The first semiconductor layer 120 is provided on the semiconductor substrate 110. The first semiconductor layer 120 is, for example, an n-type InP layer. The first semiconductor layer 120 includes a first-conductivity-type impurity with a lower concentration than a concentration of a first-conductivity-type impurity in the semiconductor substrate 110.

The active layer 130 is provided on the first semiconductor layer 120. For example, the active layer 130 has a quantum well structure that allows intersubband transitions of carriers (see FIG. 3). The active layer 130 includes, for example, an n-type Group III-V compound semiconductor crystal doped with silicon and emits light due to intersubband transitions of electrons.

The second semiconductor layer 150 is provided on the active layer 130. The second semiconductor layer 150 is, for example, an n-type InP layer. The second semiconductor layer 150 includes a first-conductivity-type impurity with a lower concentration than the concentration of the first-conductivity-type impurity in the semiconductor substrate 110.

The photonic crystal layer 140 is located between the active layer 130 and the second semiconductor layer 150 at an output end LOE of the semiconductor light-emitting device 2. The photonic crystal layer 140 has a specific periodic structure (see FIG. 10) and controls the propagation direction of the light emitted from the active layer 130. The photonic crystal layer 140 includes, for example, InGaAs.

The first electrode 160 is provided on the second semiconductor layer 150. For example, the first electrode 160 has an ohmic connection with the second semiconductor layer 150. The first electrode 160 is, for example, a metal layer that includes gold (Au).

The reflective layer 165 is provided on the second semiconductor layer 150 at the output end LOE of the semiconductor light-emitting device 2. The reflective layer 165 covers the photonic crystal layer 140. The reflective layer 165 is apart from the first electrode 160 on the second semiconductor layer 150. The reflective layer 165 is, for example, a metal layer that includes gold (Au).

The second electrode 180 is provided on the back surface of the semiconductor substrate 110 at the side opposite to the active layer 130. The semiconductor substrate 110 is positioned between the active layer 130 and the second electrode 180. The second electrode 180 is, for example, a metal layer that includes gold (Au) and titanium (Ti). The second electrode 180 has, for example, an ohmic connection with the semiconductor substrate 110.

The semiconductor light-emitting device 2 includes the surface-emitting region SER at the back surface of the semiconductor substrate 110. The surface-emitting region SER is located in the output end LOE and faces the reflective layer 165. The photonic crystal layer 140 is positioned between the reflective layer 165 and the surface-emitting region SER.

The semiconductor light-emitting device 2 includes, for example, a ridge waveguide region RWR and the output end LOE. The ridge waveguide region RWR has a stacked structure that includes the semiconductor substrate 110, the first semiconductor layer 120, the active layer 130, and the second semiconductor layer 150. The output end LOE is arranged with the ridge waveguide region RWR in the X-direction and has a stacked structure that includes the semiconductor substrate 110, the first semiconductor layer 120, the active layer 130, the photonic crystal layer 140, and the second semiconductor layer 150.

As shown in FIG. 9B, the semiconductor light-emitting device 2 has a ridge waveguide structure located on the first semiconductor layer 120. A ridge waveguide RW includes the second semiconductor layer 150, the active layer 130, and a portion of the first semiconductor layer 120. The ridge waveguide RW extends in the X-direction on the first semiconductor layer 120.

The first electrode 160 covers the ridge waveguide RW and the front surface of the first semiconductor layer 120. The first electrode 160 is electrically connected to the second semiconductor layer 150 at the upper surface of the ridge waveguide RW.

The semiconductor light-emitting device 2 further includes an insulating film 170. The insulating film 170 covers the side surface of the ridge waveguide RW and the front surface of the first semiconductor layer 120. The insulating film 170 is located between the first electrode 160 and the ridge waveguide RW and electrically insulates the first semiconductor layer 120 and the active layer 130 from the first electrode 160. The insulating film 170 is, for example, a silicon oxide film.

Figure 10:
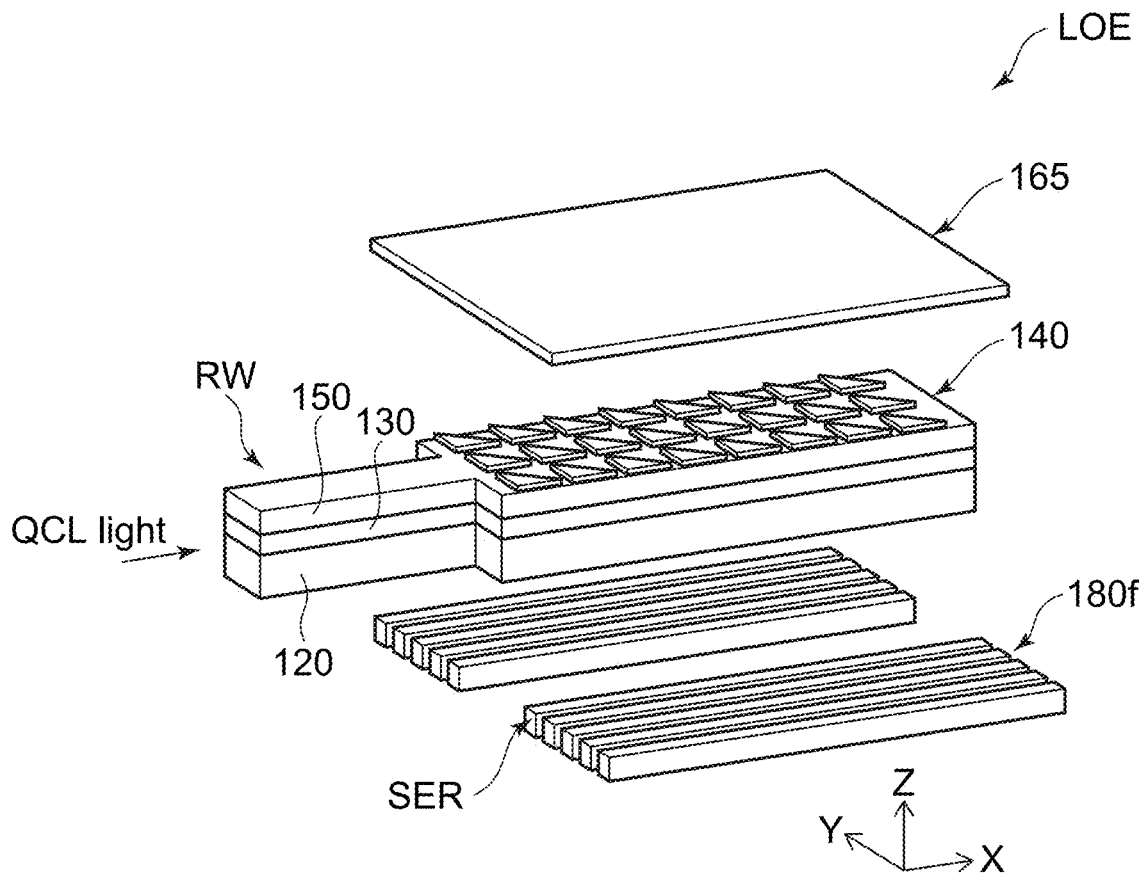
FIG. 10 is a perspective view schematically showing the output end of the semiconductor light-emitting device according to the second embodiment.

FIG. 10 is a perspective view schematically showing the output end LOE of the semiconductor light-emitting device 2 according to the second embodiment.

As shown in FIG. 10, the semiconductor light-emitting device 2 further includes multiple fine wire contact portions 180f located in the surface-emitting region SER. The fine wire contact portions 180f each extend in the same direction as the extension direction of the ridge waveguide RW, e.g., the X-direction. The multiple fine wire contact portions 180f are arranged in the Y-direction along the surface-emitting region SER (i.e., the back surface of the semiconductor substrate 110). The fine wire contact portions 180f are apart from each other. The fine wire contact portions 180f include, for example, the same material as the second electrode 180.

In the semiconductor light-emitting device 2, the QCL light propagates along the ridge waveguide RW in the extension direction of the ridge waveguide RW and enters the output end LOE. The propagation direction of the QCL light is changed by the photonic crystal layer 140 in the output end LOE.

The photonic crystal layer 140 acts as a two-dimensional diffraction grating due to the refractive index difference of the periodic structure and controls the emission angle of the QCL light. The photonic crystal layer 140 is provided so that the QCL light is emitted in a direction that is substantially perpendicular to the boundary between the active layer 130 and the first semiconductor layer 120. For example, "substantially perpendicular" means that the angle of the propagation direction of the QCL light with respect to the boundary between the active layer 130 and the first semiconductor layer 120 is not less than 81° and not more than 99°.

After the propagation direction of the QCL light is changed by the photonic crystal layer 140, the QCL light propagates in the direction from the active layer 130 toward the back surface of the semiconductor substrate 110 and is externally emitted from the surface-emitting region SER. On the other hand, the QCL light that propagates in the direction from the active layer 130 toward the reflective layer 165 is reflected by the reflective layer 165 and propagates in the direction toward the back surface of the semiconductor substrate 110. As a result, the QCL light from the ridge waveguide region RWR that is incident on the output end LOE is externally emitted from the surface-emitting region SER The multiple fine wire contact portions 180f that are provided in the surface-emitting region SER act as a onedimensional diffractive lens and control the propagation direction of the QCL light emitted from the surface-emitting region SER.

Figures 11A, 11B, 11C:
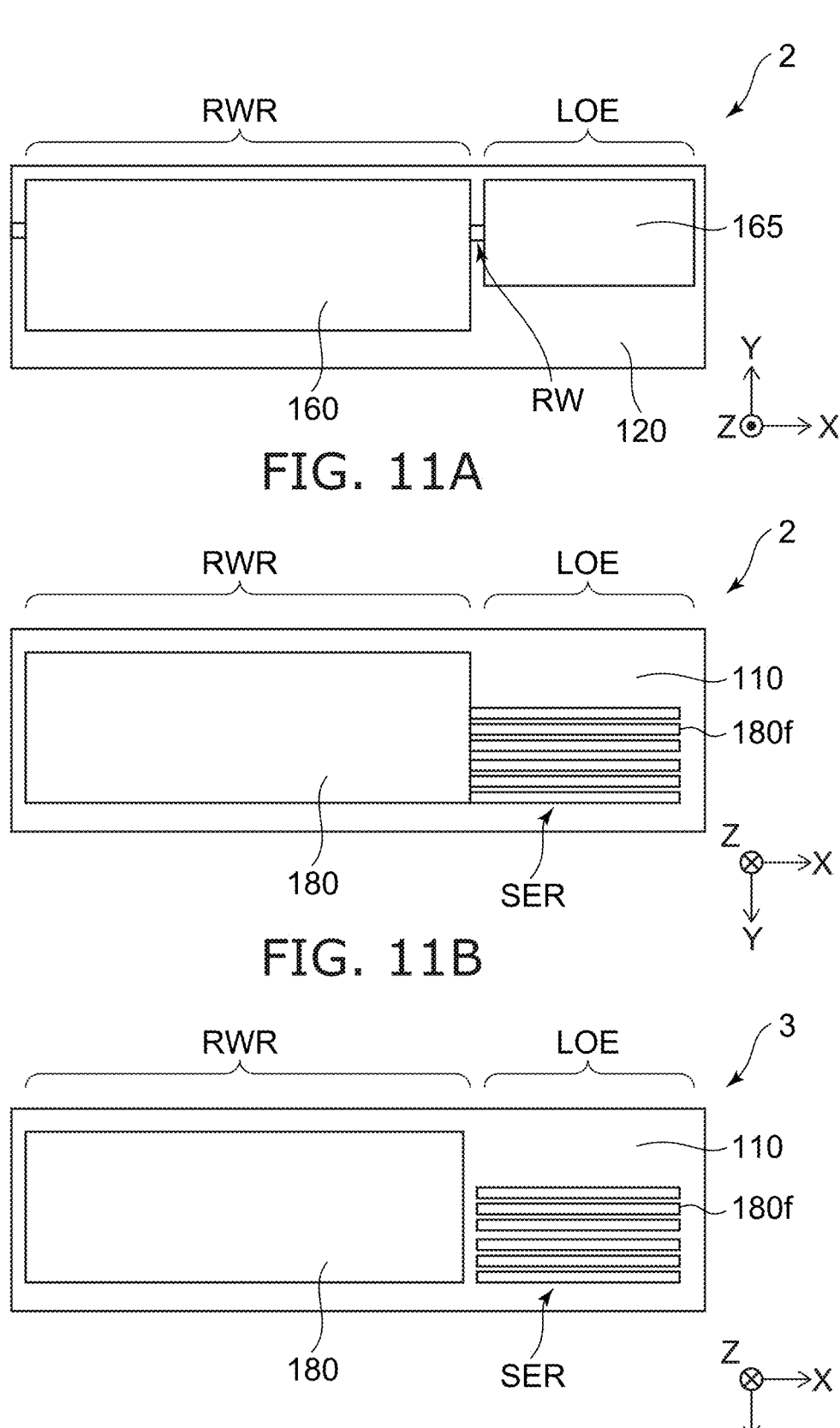
FIGS. 11A to 11C are schematic plan views showing the semiconductor light-emitting device according to the second embodiment.

FIGS. 11A to 11C are schematic plan views showing the semiconductor light-emitting device 2 according to the second embodiment. FIG. 11A is a plan view showing the front surface of the semiconductor light-emitting device 2. FIGS. 11B and 11C are plan views showing the back surface of the semiconductor substrate 110.

As shown in FIG. 11A, the first electrode 160 is provided in the ridge waveguide region RWR and covers the ridge waveguide RW. The reflective layer 165 is apart from the first electrode 160 and is provided in the output end LOE. For example, the first electrode 160 and the reflective layer 165 are arranged in the X-direction in the extension direction of the ridge waveguide RW.

As shown in FIG. 11B, the second electrode 180 is provided on the back surface of the semiconductor substrate 110 in the ridge waveguide region RWR. For example, the fine wire contact portion 180f extends from the second electrode 180 into the surface-emitting region SER. One end of the fine wire contact portion 180f is linked to the second electrode 180; and the other end of the fine wire contact portion 180f is positioned in the surface-emitting region SER.

As shown in FIG. 11C, the fine wire contact portion 180f may be apart from the second electrode 180 and is provided in the surface-emitting region SER.

Figure 12A:
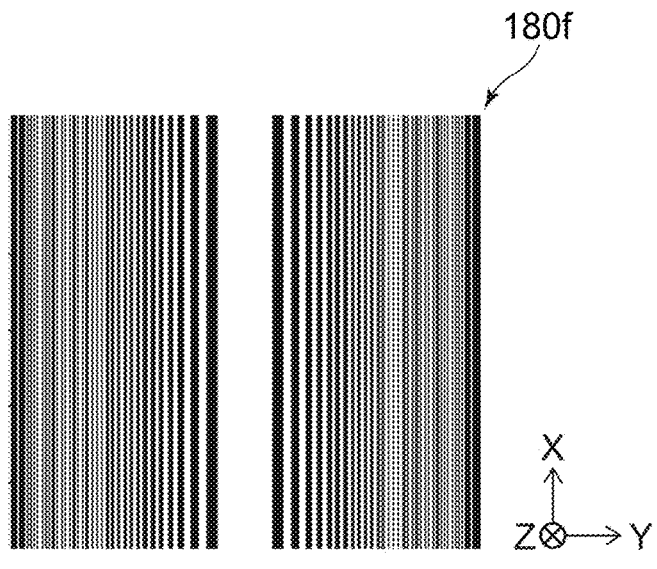
FIGS. 12A and 12B are schematic views showing output characteristics of the semiconductor light-emitting device according to the second embodiment.
Figure 12B:
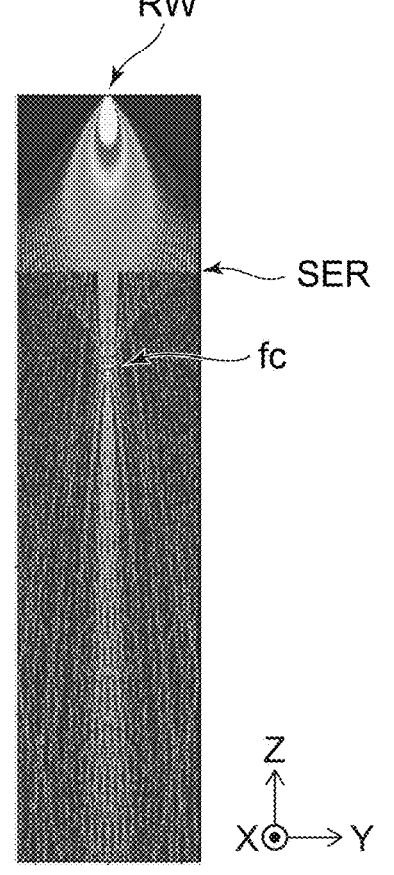

FIGS. 12A and 12B are schematic views showing output characteristics of the semiconductor light-emitting device 2 according to the second embodiment. FIG. 12A is a plan view illustrating the arrangement of the fine wire contact portions 180f. FIG. 12B is a cross-sectional view illustrating the propagation path of the QCL light.

As shown in FIG. 12A, the multiple fine wire contact portions 180f are arranged so that the spacing between the fine wire contact portions 180f adjacent to each other in the Y-direction decreases in the +Y direction and the −Y direction away from the center of the arrangement.

As shown in FIG. 12B, the QCL light of which the propagation direction is changed by the photonic crystal layer 140 propagates toward the surface-emitting region SER and passes between the fine wire contact portions 180f. The QCL light is diffracted by the fine wire contact portions 180f and is concentrated at, for example, a position fc that is apart in the −Z direction from the surface-emitting region SER (i.e., the back surface of the semiconductor substrate 110).

Figure 13A:
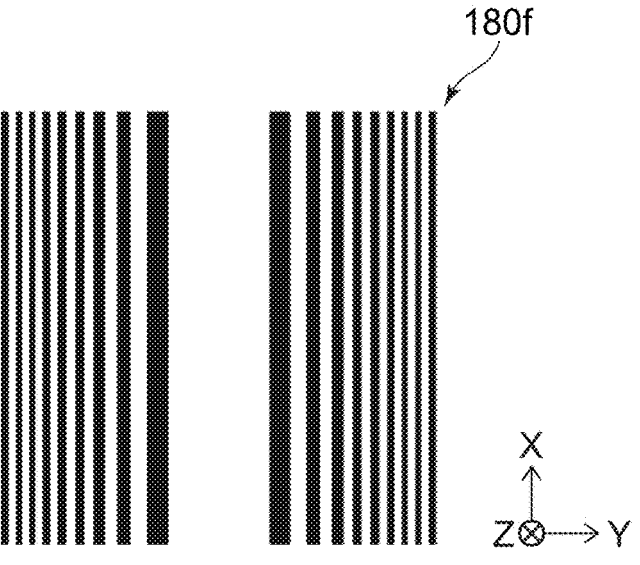
FIGS. 13A and 13B are schematic views showing output characteristics of the semiconductor light-emitting device according to a modification of the second embodiment.
Figure 13B:
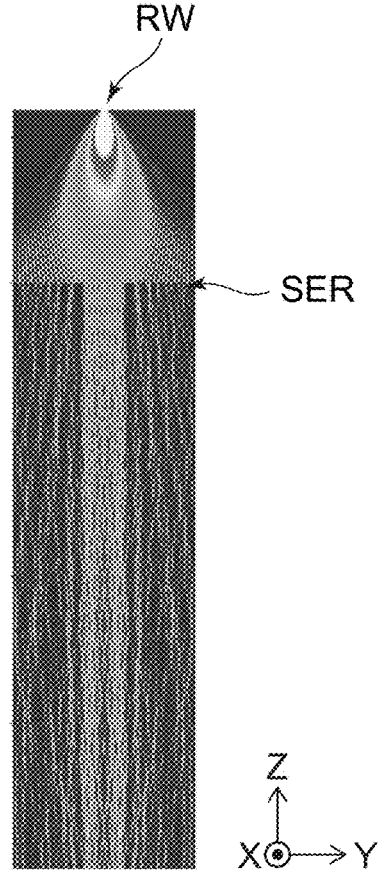

FIGS. 13A and 13B are schematic views showing output characteristics of the semiconductor light-emitting device 2 according to a modification of the second embodiment. FIG. 13A is a plan view illustrating the arrangement of the fine wire contact portions 180f. FIG. 13B is a cross-sectional view illustrating the propagation path of the QCL light.

As shown in FIG. 13A, the multiple fine wire contact portions 180f are arranged so that the spacing between the fine wire contact portions 180f adjacent to each other in the Y-direction decreases in the +Y direction and the −Y direction away from the center of the arrangement. In the example, the spacing of the adjacent fine wire contact portions 180f is wider than that of the arrangement shown in FIG. 12A.

As shown in FIG. 13B, the QCL light propagates toward the surface-emitting region SER and passes between the fine wire contact portions 180f. The QCL light that is diffracted by the fine wire contact portions 180f is externally emitted as parallel light.

Figure 14:
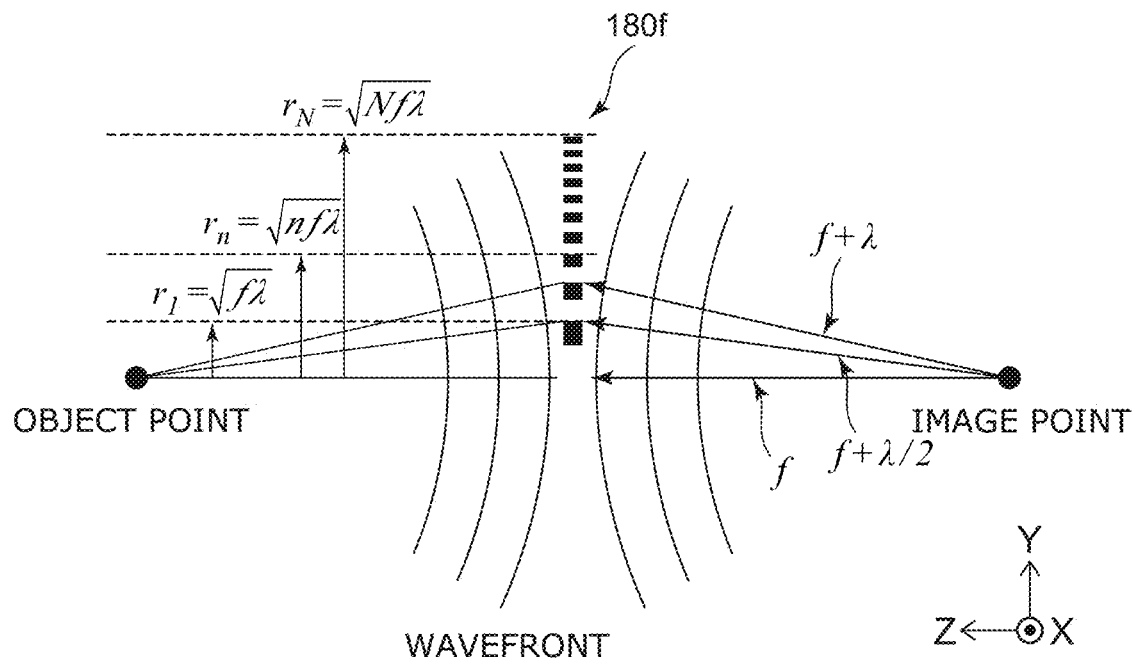
FIG. 14 is a schematic view illustrating a diffractive lens of the semiconductor light-emitting device according to the second embodiment.

FIG. 14 is a schematic view illustrating a diffractive lens of the semiconductor light-emitting device 2 according to the second embodiment. For example, the light that passes from the object point through the diffractive lens (the fine wire contact portions 180$f$) and reaches the image point is concentrated at the image point when the optical path lengths are different from each other by integer multiples of the wavelength. Also, the light is concentrated at the image point when the optical path lengths match each other.

For example, if the object point is at infinity in the Z-direction from the fine wire contact portions 180$f$, the light that is incident on the fine wire contact portions 180$f$ is parallel light and has a wavefront that is parallel to the direction (the Y-direction) in which the fine wire contact portions 180$f$ are arranged. In such a case, the light is concentrated at the image point when the distance from the center of the arrangement in the Y-direction of the fine wire contact portions 180$f$ to the outer edge of each fine wire contact portion 180$f$ is equal to the square root of n$f\lambda$. Here, "n" is an integer; and "f" is the distance from the center of the arrangement of the fine wire contact portions 180$f$ to the image point. "$\lambda$" is the wavelength of the light. The line width of each fine wire is set not to contact the neighboring fine wires. The focusing efficiency can be optimized by adjusting the line width.

Although the arrangement of the fine wire contact portions 180$f$ has line symmetry in the example described above, the embodiment is not limited thereto. For example, the fine wire contact portions 180$f$ may be arranged to be rotationally asymmetric.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A surface-emitting semiconductor light-emitting device, comprising:
   a semiconductor substrate of a first conductivity type;
   a first semiconductor layer provided on a front surface of the semiconductor substrate, the first semiconductor layer being of the first conductivity type;
   an active layer provided on the first semiconductor layer;
   a photonic crystal layer provided on the active layer, the photonic crystal layer including a plurality of protrusions arranged along an upper surface of the active layer;
   a second semiconductor layer provided on the photonic crystal layer, the second semiconductor layer being of the first conductivity type;
   a first electrode provided on the second semiconductor layer; and
   a second electrode provided on a back surface of the semiconductor substrate, the semiconductor substrate being positioned between the first semiconductor layer and the second electrode,
   the second electrode including
      a planar contact portion contacting the back surface of the semiconductor substrate, and
      a plurality of fine wire contact portions extending into a surface-emitting region in the back surface of the semiconductor substrate, the light radiated from the active layer being externally emitted from the surface-emitting region,
   the fine wire contact portions being arranged in the surface-emitting region,
   the fine wire contact portions being rotationally asymmetric, and
   the fine wire contact portions having neither line symmetry nor point symmetry.

2. The device according to claim 1, wherein the planar contact portion surrounds the surface-emitting region on the back surface of the semiconductor substrate.

3. The device according to claim 1, wherein the fine wire contact portions include first and second ends, the first end being linked to the planar contact portion, the second end being positioned in the surface-emitting region.

4. The device according to claim 3, wherein the second electrode includes a first fine wire contact portion and a second fine wire contact portion, the first fine wire contact portion having a first length from the first end to the second end, the second fine wire contact portion having a second length from the first end to the second end; and the first length is different from the second length.

5. The device according to claim 1, wherein the second electrode includes a first fine wire contact portion and a second fine wire contact portion, the first fine wire contact portion extending in a first direction directed along the back surface of the semiconductor substrate, the second fine wire contact portion extending in a second direction directed along the back surface of the semiconductor substrate; and the second direction being orthogonal to the first direction.

6. The device according to claim 1, wherein the fine wire contact portions include first and second portions, the first portion extending in a first direction directed along the back surface of the semiconductor substrate; the second portion branching from the first portion in a second direction directed along the back surface of the semiconductor substrate, and the second direction crosses the first direction.

7. The device according to claim 1, wherein at least one of the fine wire contact portions extends in a straight line.

8. The device according to claim 1, wherein at least one of the fine wire contact portions includes a portion extending in a curved shape along the back surface of the semiconductor substrate.

9. The device according to claim 1, wherein the active layer includes a ridge structure extending in a first direction directed along the back surface of the semiconductor substrate.

10. The device according to claim 9, wherein the active layer includes an output end linked to the ridge structure;
the photonic crystal layer is provided between the second semiconductor layer and the output end of the active layer; and
the output end of the active layer is located between the photonic crystal layer and the plurality of fine wire contact portions.

11. The device according to claim 10, further comprising:

a reflective layer provided on the second semiconductor layer, the reflective layer being apart from the first electrode, the reflective layer including a material that reflects light radiated from the active layer, the photonic crystal layer being provided between the reflective layer and the output end of the active layer.

12. The device according to claim 9, wherein the second electrode includes at least two of the plurality of the fine wire contact portions extending in the first direction, and the at least two of the plurality of fine wire contact portions are arranged in a second direction directed along the back surface of the semiconductor substrate, the second direction being orthogonal to the first direction.

13. The device according to claim 1, wherein the active layer includes a quantum well structure generating intersubband transitions of electrons.

14. The device according to claim 1, wherein the photonic crystal layer includes a periodic structure that controls a propagation direction of light radiated from the active layer, and the propagation direction is changed toward the back surface of the semiconductor substrate by the photonic crystal layer.

15. The device according to claim 14, wherein the surface-emitting region overlaps the periodic structure of the photonic crystal layer in a plan view parallel to the back surface of the semiconductor substrate.

16. The device according to claim 14, wherein the first electrode includes a material reflecting light radiated from the active layer.

17. The device according to claim 15, wherein a mesa structure is provided on the semiconductor substrate, the mesa structure including the active layer, the photonic crystal layer, and the second semiconductor layer; and the first electrode covers a side surface of the mesa structure.

18. The device according to claim 1, wherein the surface-emitting region is defined by the planar contact portion, the surface emitting region has a circular shape, and the fine wire contact portions extend longitudinally from the circular shape.

19. The device according to claim 1, wherein each of the fine wire contact portions comprises a longitudinal member with a width of 10-20 $\mu$m connected at one end to the planar contact portion.

\* \* \* \* \*